(12) United States Patent
Hayem et al.

(10) Patent No.: US 6,546,514 B1
(45) Date of Patent: Apr. 8, 2003

(54) INTEGRATED CIRCUIT ANALYSIS AND DESIGN INVOLVING DEFECTIVE CIRCUIT ELEMENT REPLACEMENT ON A NETLIST

(75) Inventors: Frederic Hayem, San Diego, CA (US); Patrick Arnould, Antibes (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/460,254

(22) Filed: Dec. 13, 1999

(51) Int. Cl.[7] .............................................. G01R 31/28
(52) U.S. Cl. ...................... 714/741; 714/726
(58) Field of Search ............................... 714/736, 726, 714/741, 744; 364/578, 490; 395/500; 716/8

(56) References Cited

U.S. PATENT DOCUMENTS

| | | | | |
|---|---|---|---|---|
| 4,893,072 A | * | 1/1990 | Matsumoto .................. | 714/736 |
| 5,111,413 A | * | 5/1992 | Lazansky et al. ........... | 364/578 |
| 5,629,860 A | * | 5/1997 | Jones et al. .................. | 364/490 |
| 5,754,826 A | * | 5/1998 | Gamal et al. ................ | 395/500 |
| 5,938,782 A | | 8/1999 | Kay ............................ | 714/726 |
| 6,219,813 B1 | * | 4/2001 | Bishop et al. ............... | 714/736 |
| 6,308,309 B1 | * | 10/2001 | Gan et al. ....................... | 716/8 |

* cited by examiner

Primary Examiner—David Ton
(74) Attorney, Agent, or Firm—Peter Zawilski

(57) ABSTRACT

A method of operating on a net-list describing an integrated circuit design for use with an automated test pattern generator for testing an integrated circuit built using the design is described. The method includes replacing a defective portion of the design in test mode with a substitute circuit to reduce testing impact of the defective portion. The method includes identifying a first defective portion of the integrated circuit design in the net-list, determining conditions under which the first defective portion is likely to malfunction and replacing the first defective portion in the net-list with another first portion that provides unknown output signals representing an unknown state in response to conditions under which the first defective portion is likely to malfunction.

20 Claims, 5 Drawing Sheets

INTEGRATED CIRCUIT ANALYSIS AND DESIGN INVOLVING DEFECTIVE CIRCUIT ELEMENT REPLACEMENT ON A NETLIST

TECHNICAL FIELD

The present invention relates to a method of operating on a net-list describing an integrated circuit design, a method of generating test vectors to provide reduced numbers of miscompares between measured test results from a prototype integrated circuit design and simulated performance of the prototype integrated circuit design and a method of improving testability of an integrated circuit design.

BACKGROUND OF THE INVENTION

Integrated circuits have become increasingly complex, with the result that modeling and testing of integrated circuits has also become increasingly complex. In modeling and testing of integrated circuits and of new integrated circuit designs, it is increasingly difficult to discriminate between testing errors and performance errors as the intricacy of the integrated circuit being modeled or tested increases. Additionally, analysis of modeling results has become increasingly computationally intensive.

As a result, techniques for automating modeling and testing have been developed. One such technique, known as scan test, divides a proposed digital circuit design into scan paths using test logic that is to be built into the digital circuit, as is described, for example, in co-pending U.S. patent application Ser. No. 08/719,149, now U.S. Pat No. 5,938,782, which is assigned to the assignee of this application and which is hereby incorporated herein by reference. A scan path includes combinatorial logic and has an output signal that is solely a function of one input signal when appropriate test signals are applied to various parts of the digital circuit to isolate the scan path from other portions of the circuit and to capture input and output signals in flip flops that are included along the scan path.

Typically, each scan path consists of combinatorial logic, with a first flip-flop at or near a first end of the scan path latching a first signal and a second flip-flop at a second end of the scan path latching a second signal. The first and second signals may be input signals or output signals, depending on the tests being carried out and also depending on when the signals are sampled during a scan test. Multiple scan paths may be serially coupled together to form scan chains, where the output signal is a function of only one input signal. As a result, a number of circuit elements may be collectively tested by monitoring a limited number of signals, reducing the number of test signals that need to be supplied to the integrated circuit and also the number of output signals that must be analyzed in order to assess functionality of the circuit.

An automatic test pattern generator (ATPG) analyzes a description of the logic functions in the integrated circuit, known as a net-list, and from the net-list synthesizes a series of input signals known as test vectors. The test vectors are input to a corresponding series of scan chains when the circuit being tested is set to the test mode of operation. The ATPG also synthesizes a series of simulated output signals. Measured scan output signals are compared with their expected values from simulation to determine which output signals correspond to their expected values and which output signals are erroneous, i.e., have values that do not correspond with their expected values. Erroneous output signals from the scan chains may result from a variety of causes.

A first potential cause may be a malfunction of the combinatorial circuitry in the scan path. This type of malfunction is what the scan architecture is intended to capture and identify.

A second potential cause may be a malfunction of the flip-flop that is intended to capture the output signal from the scan path. This may be due, for example, to improper clocking or reset behavior of the scan flip-flop, which may be caused by noise or spikes in the clock signal applied to the flip-flop. This may also be due to latching of false data by the flip-flop, which may be caused by a race condition or clock skew. These kinds of error signals are the result of problems occurring during data capture by the flip-flops.

A third potential cause of error can be clock skew or missing clock pulses, giving rise to resetting of flip-flops, among other things. When these occur in the scan chain, they result in unexpected resetting of one or more scan flip-flops following data capture, destroying the scan data. Erroneous gating or defective multiplexer operation in the prototype integrated circuit design may also result in corruption of the output signal from the prototype integrated circuit. These kinds of problems are associated with defects in shifting data through the prototype integrated circuit.

However, when one or more defects of one or more types are present, the output signals obtained in this manner are not easily interpreted. Further, it may be extremely difficult to discriminate between errors due to malfunction of the circuitry under test and errors due to problems that are only associated with the test mode of operation, such as problems occurring during the data capture and data shift operations. These latter problems are not indicative of defects in the circuitry being tested.

Typically, output data captured in response to application of a test vector from the ATPG are arranged in text files. Examination of the output data coupled with detailed parsing of the data flow through the integrated circuit being tested is needed to trace propagation of test signals through the circuit being tested in order to determine where the error or errors occurred during the course of the test. This process is extremely labor intensive and frequently is also subject to errors in interpretation.

In effectuating a new integrated circuit design, a series of photomasks are designed. When these masks have been made, they are used to build a prototype of the new integrated circuit design. Typically, the ATPG is used to generate test vectors after the photomasks have been designed and the design has been given to the photomask facilities. This happens because the test vectors typically are not needed for testing of the prototype integrated circuit until several weeks after the photomask has been designed, and because there is no reason, from a marketing point of view, to generate the test vectors earlier.

One problem with this approach is that when a malfunction of the new integrated circuit design is found during the course of generating the test vectors, the consequences may be severe. These may require the design team to mask (or ignore) one or more outputs from the new integrated circuit prototype, which results in dramatically decreased fault coverage. In severe cases, these malfunctions may cause the design team to cancel the photomask design and to generate a revised mask design, or to order new photomasks and to build a second prototype integrated circuit from the new photomasks.

When problems are due to unexpected behavior, such as resetting of a flip-flop in the scan chain, a large number of miscompares may be noted between the expected or simulated results and the results that are measured from a prototype of a new integrated circuit design. What is needed is a way to reduce the number of miscompares between expected test results and measured test results from a prototype integrated circuit design with less reduction of test coverage than occurs when an output is masked.

SUMMARY OF THE INVENTION

In one aspect, the present invention includes a method of operating on a net-list describing an integrated circuit design for use with an automated test pattern generator for testing an integrated circuit built using the design. The method includes replacing a defective portion of the design in test mode with a substitute circuit to reduce testing impact of the defective portion by identifying a first defective portion of the integrated circuit design in the net-list, determining conditions under which the first defective portion is likely to malfunction and replacing the first defective portion in the net-list with another first portion that provides unknown output signals representing an unknown state in response to conditions under which the first defective portion is likely to malfunction.

In another aspect, the present invention includes a method of generating test vectors to provide reduced numbers of miscompares between measured test results from a prototype integrated circuit design and simulated performance of the prototype integrated circuit design. The method includes identifying timing conditions in the prototype integrated circuit design that cause improper flip-flop behavior and creating a circuit design that identifies a time and duration corresponding to conditions under which the improper flip-flop behavior occur. The method also includes modifying a net-list corresponding to the prototype integrated circuit design to include the circuit design and generating test vectors and simulated output signals corresponding to the modified net-list.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the Progress of Science and useful Arts" (Article 1, Section 8).

Figure 1:
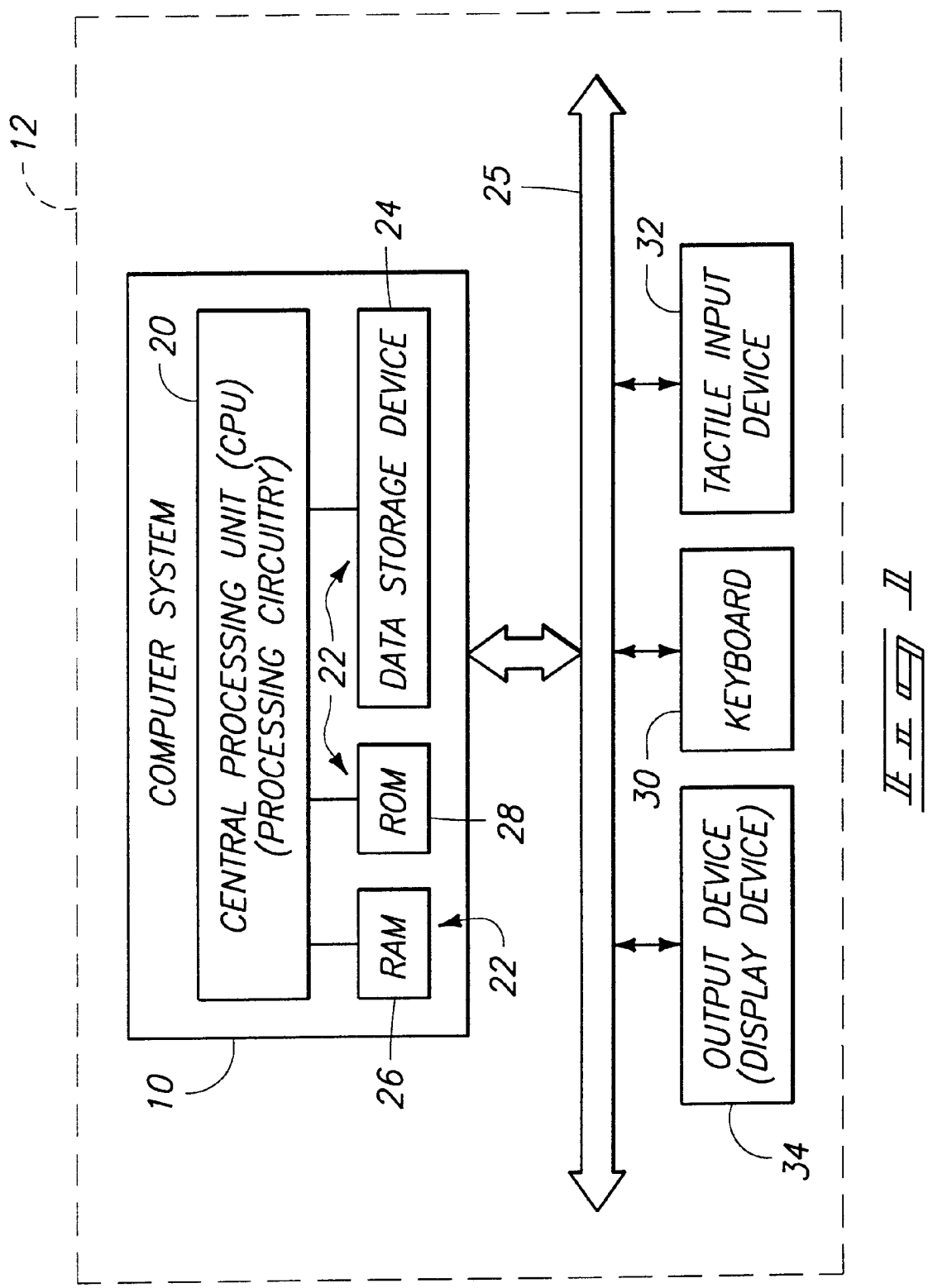
FIG. 1 is a simplified block diagram of a computer aided design (CAD) system, in accordance with an embodiment of the present invention.

FIG. 1 is a simplified block diagram of a computer system incorporating novel aspects of the present invention and identified by reference numeral 10. The computer system 10 is configured to implement an electronic design automation (EDA) system 12 that is capable of simulating operation of a design for an integrated circuit. A circuit designer inputs an integrated circuit design that includes design-for-testability features, validates the design, places components onto a chip layout and routes connections between components. According to one construction, an integrated circuit under design and test comprises an application specific integrated circuit (ASIC).

The electronic design automation (EDA) system 12 includes a central processing unit (CPU), or processor, 20 and a memory 22, coupled to other elements of the system 12 via a bus 25. In one form, the memory 22 comprises a random access memory 26, a read only memory 28 and the data storage device 24. In one form, the data storage device 24 comprises a hard disk drive. The CPU 20 is used to implement an operating system and application programs, such as EDA and ATPG programs. Furthermore, the CPU 20 is used to implement the novel features of the present invention.

A human designer, user or operator inputs design information into the system 12 via a keyboard 30 and/or a cursor manipulating tactile input device 32, such as a mouse or a touchpad. However, it is understood that other forms of input devices can also be used including voice recognition systems, joysticks, graphics tablets, data readers, card readers, magnetic and optical readers, other computer systems etc. The designer receives visual feedback on the design process via an output device 34. According to one construction, the output device 34 comprises a graphics display terminal, such as a CRT display or a liquid crystal display. During synthesis and testing of a design, the memory 22 is used to store logic design information for an integrated circuit under design.

Figure 2:
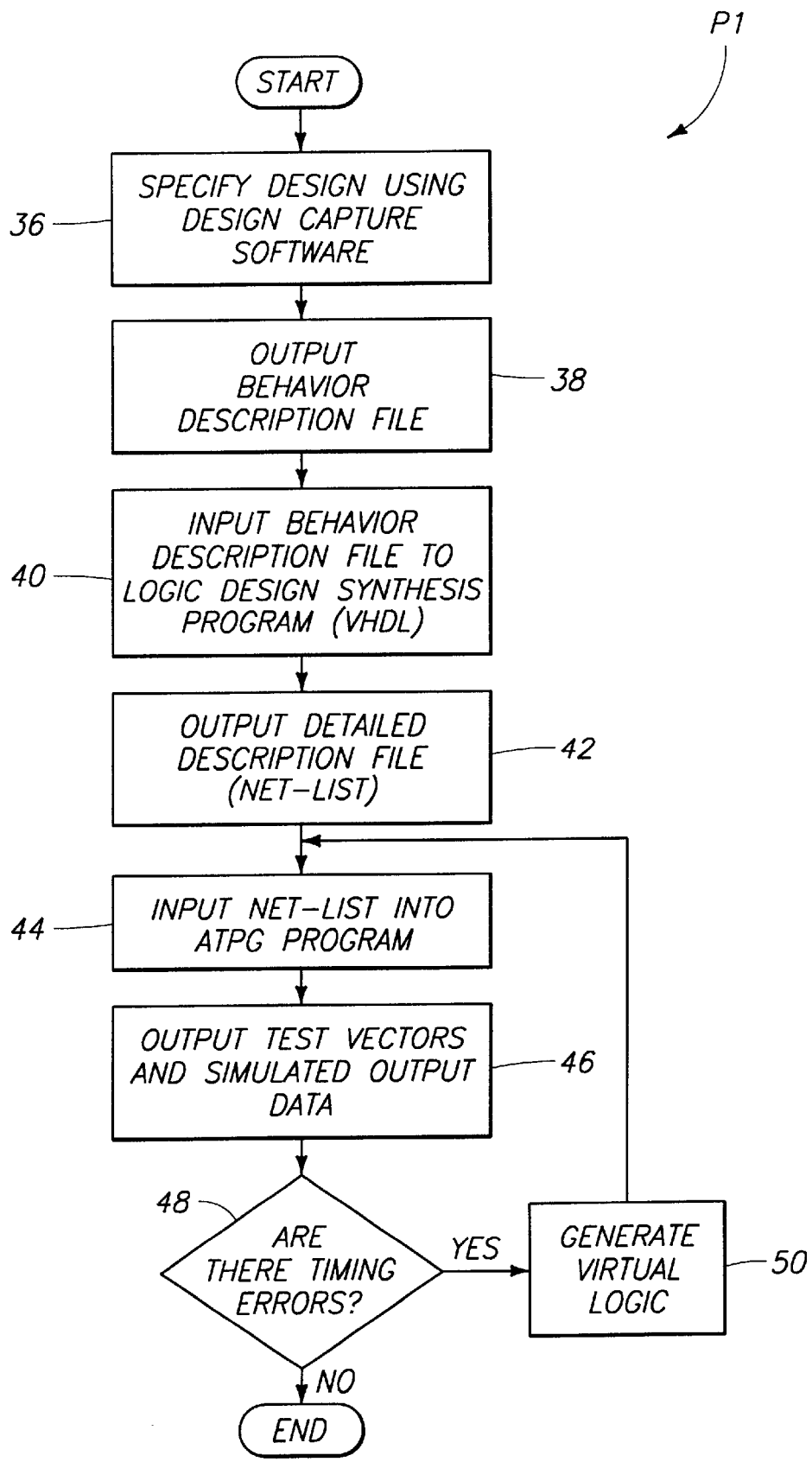
FIG. 2 is a simplified flow chart of a design process for an integrated circuit having design-for-testability features pursuant to the techniques of the present invention.

FIG. 2 is a simplified flow chart of a design process P1 for an integrated circuit having design-for-testability features pursuant to the techniques of the present invention. In a step 36, the designer specifies the logic design of the integrated circuit via a commercially available form of design capture software such as software that is available from Synopsys, Inc. and Cadence Design Systems, Inc.

In a step 38, a behavior description file is output from the design capture software. The behavior description file is written in a hardware description language (HDL), such as VHDL or VERILOG. The behavior description file represents the logic design of a proposed design at a register transfer level.

In a step 40, the behavior description file from the step 38 is input to a logic design synthesis program, such as a HDL design compiler. The logic design synthesis program is operative to create circuitry and gates necessary to realize a design that has been specified by the behavior description file that was output from the step 38. One commercially available HDL design compiler is sold by Synopsys, Inc.

In a step 42, the HDL design compiler cooperates with the logic synthesis design program to generate a detailed description file. The detailed description file includes a gate-level definition of the logic design for the proposed integrated circuit design. The detailed description file comprises a net-list for the design under consideration.

In a step 44, the detailed description file is input into several EDA system programs such as an ATPG program, as well as placement and routing tools, timing analyzers and simulation programs. The ATPG program generates test vectors that are used in the system 12 to simulate operation of a proposed design for the integrated circuit, using the net-list.

In a step 46, the system 12 uses the ATPG program to provide test vectors and simulated data output as a text file.

In a query task 48, the designer using the process P1 determines if there are malfunctions in the prototype design from examination of the output text file. When the malfunctions are of the kinds of timing errors noted above due to flip-flop malfunction, the number of miscompares that are generated between simulation of the prototype design and measurement of the prototype integrated circuit may be reduced by generating suitable additional "virtual" logic elements in a step 50. The virtual logic elements are inserted into the net-list and steps 44 through 48 are repeated. This also generates new test vectors from the resultant revised net-list, as will be discussed below with respect to FIGS. 3–5. The added logic elements are referred to as virtual logic elements because, in the described embodiment, they exist in software and will not be built in the form of an integrated circuit. When no further malfunctions are noted during the query task 48, the process P1 ends.

Figure 3:
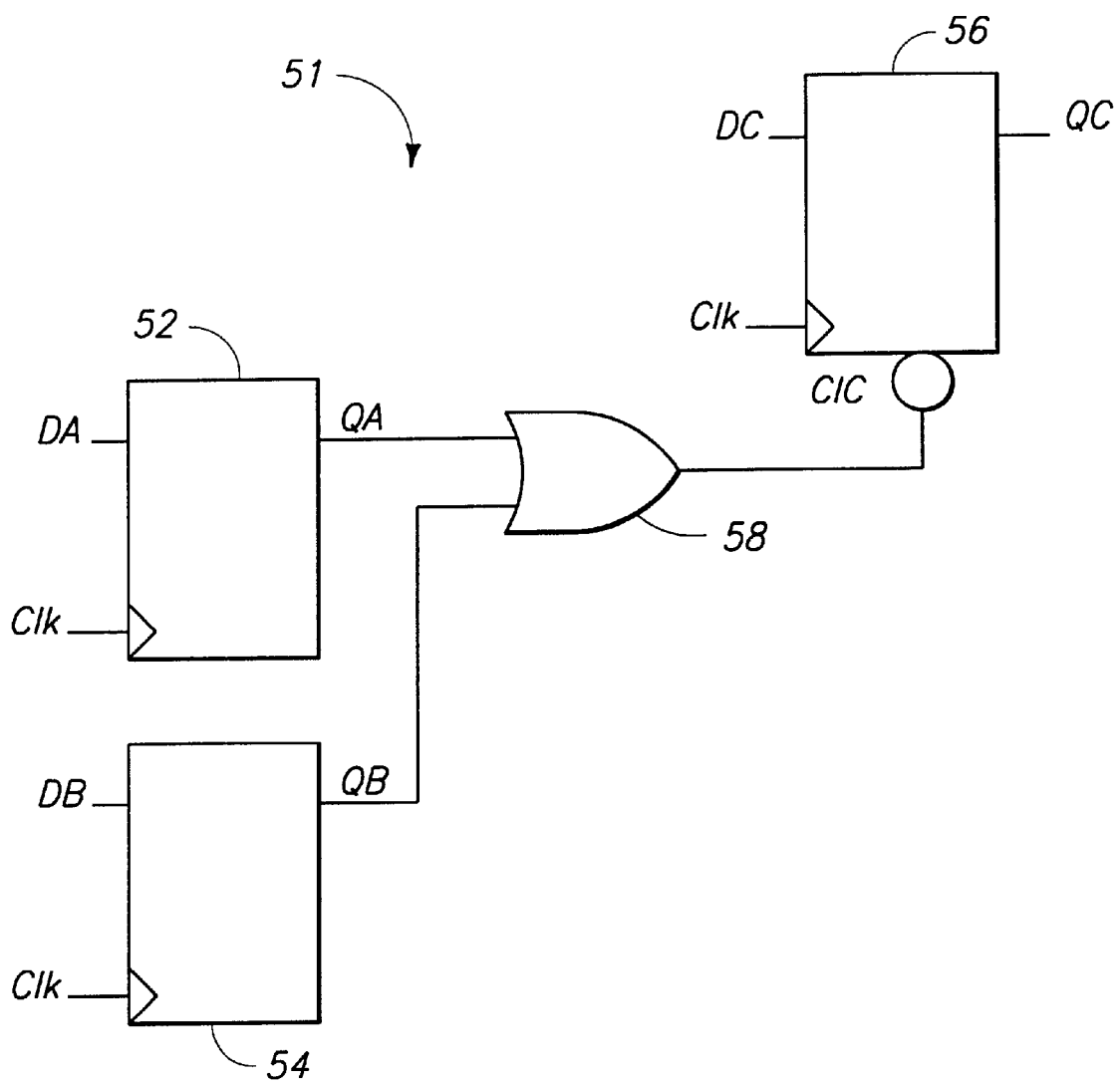
FIG. 3 is a simplified schematic diagram of a portion of an integrated circuit design, in accordance with the prior art.

FIG. 3 is a simplified schematic diagram of a circuit portion 51 of an integrated circuit design, in accordance with the prior art. The circuit 51 shown in FIG. 3 includes flip-flops 52, 54 and 56 and an OR gate 58. An output QA from the flip-flop 52 is coupled to a first input to the OR gate 58 and an output QB from the flip-flop 54 is coupled to a second input to the OR gate 58. An output of the OR gate 58 is coupled to a reset input CIC of the flip-flop 56.

Errors can occur when, for example, the outputs QA and QB cannot switch at the same time in functional mode, but must switch simultaneously in scan mode. If, for example, QA goes from logic "0" to logic "1" before QB goes from logic "1" to logic "0", CIC may switch momentarily to logic "0" and thereby reset the flip-flop 56. However, the ATPG tool does not have this timing information and therefore will not be able to predict this reset event. Accordingly, the ATPG tool will predict that the output QC of the flip-flop 56 will be set to whatever value is present at input DC to the flip-flop 56, and will not predict that the flip-flop 56 may be reset so that the actual value is logic "0". This situation leads to a probable mismatch between a value obtained by bench testing of a prototype integrated circuit and the simulation values obtained from the ATPG tool from the first iteration of the process P1 of FIG. 2.

Figure 4:
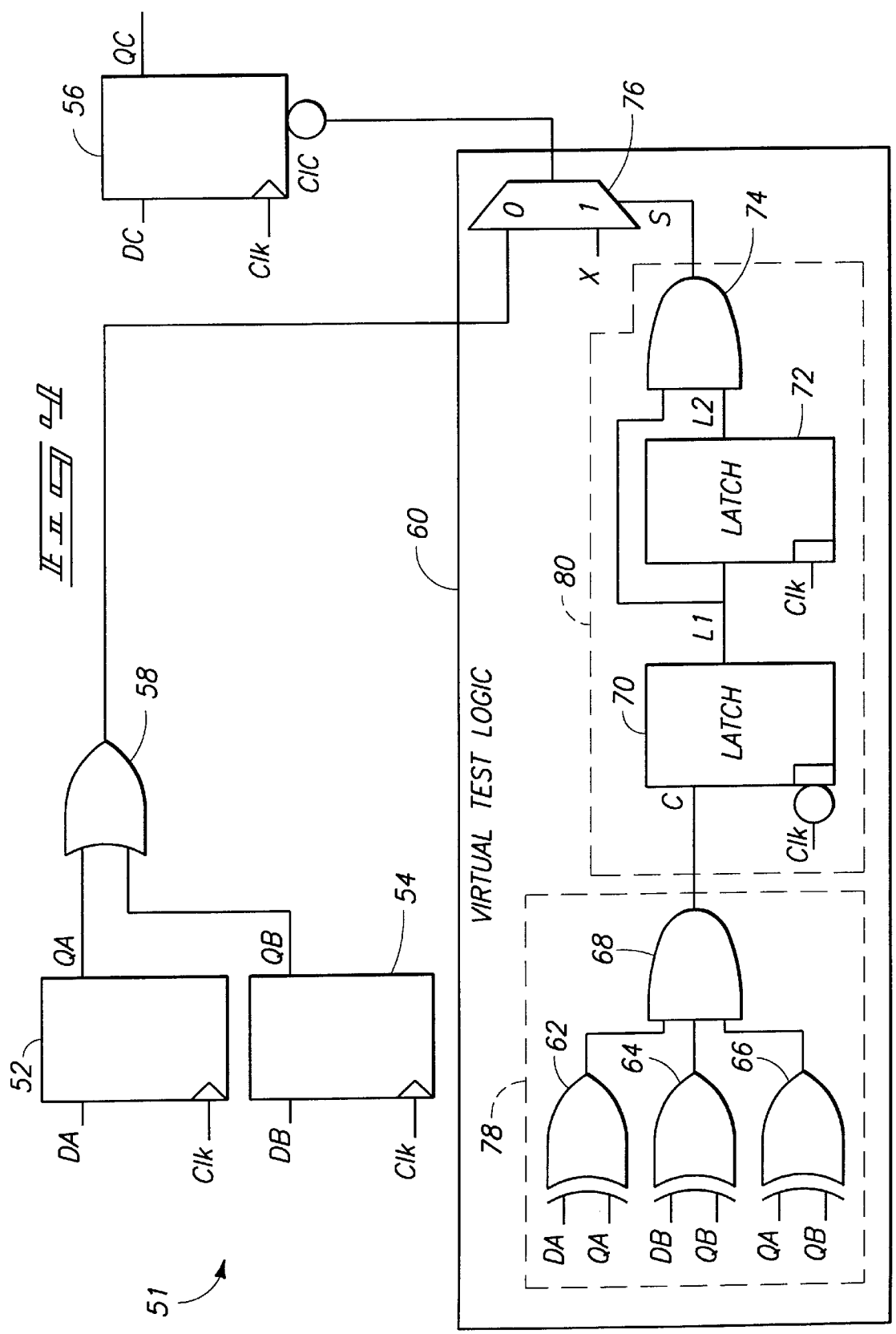
FIG. 4 is a simplified schematic diagram of the integrated circuit design of FIG. 3 including a virtual circuit, corresponding to a modified net-list of a prototype integrated circuit design, in accordance with an embodiment of the present invention.

When situations of the types described above are found in the query task 48 during iteration of the process P1, the designer can modify the circuit design used to generate test vectors and simulated output signals by creating the virtual circuit 60 of FIG. 4. The virtual circuit 60 substitutes an unknown value "X" at the CIC input to the flip-flop 56 when the conditions that could cause a timing error or glitch to reset the flip-flop 56 occur. The virtual circuit 60 also allows normal operation of the circuit 51 when those conditions do not occur, as is discussed below in more detail.

The virtual circuit 60, in this example, includes exclusive OR ("XOR") gates 62, 64 and 66, a three-input AND gate 68, a first latch 70, a second latch 72, a two-input AND gate 74 and a multiplexer 76. The XOR gates 62, 64 and 66 and the AND gate 68 form a combinatorial logic circuit 78 that detects the occurrence of a potential glitch, while the latches 70 and 72 and the AND gate 74 form a sequential logic circuit 80 that identifies an appropriate duration during which the potential glitch situation may affect operation of the circuit 51. An output from the sequential logic circuit 80 is coupled to a toggle input to the multiplexer 76.

Figure 5:
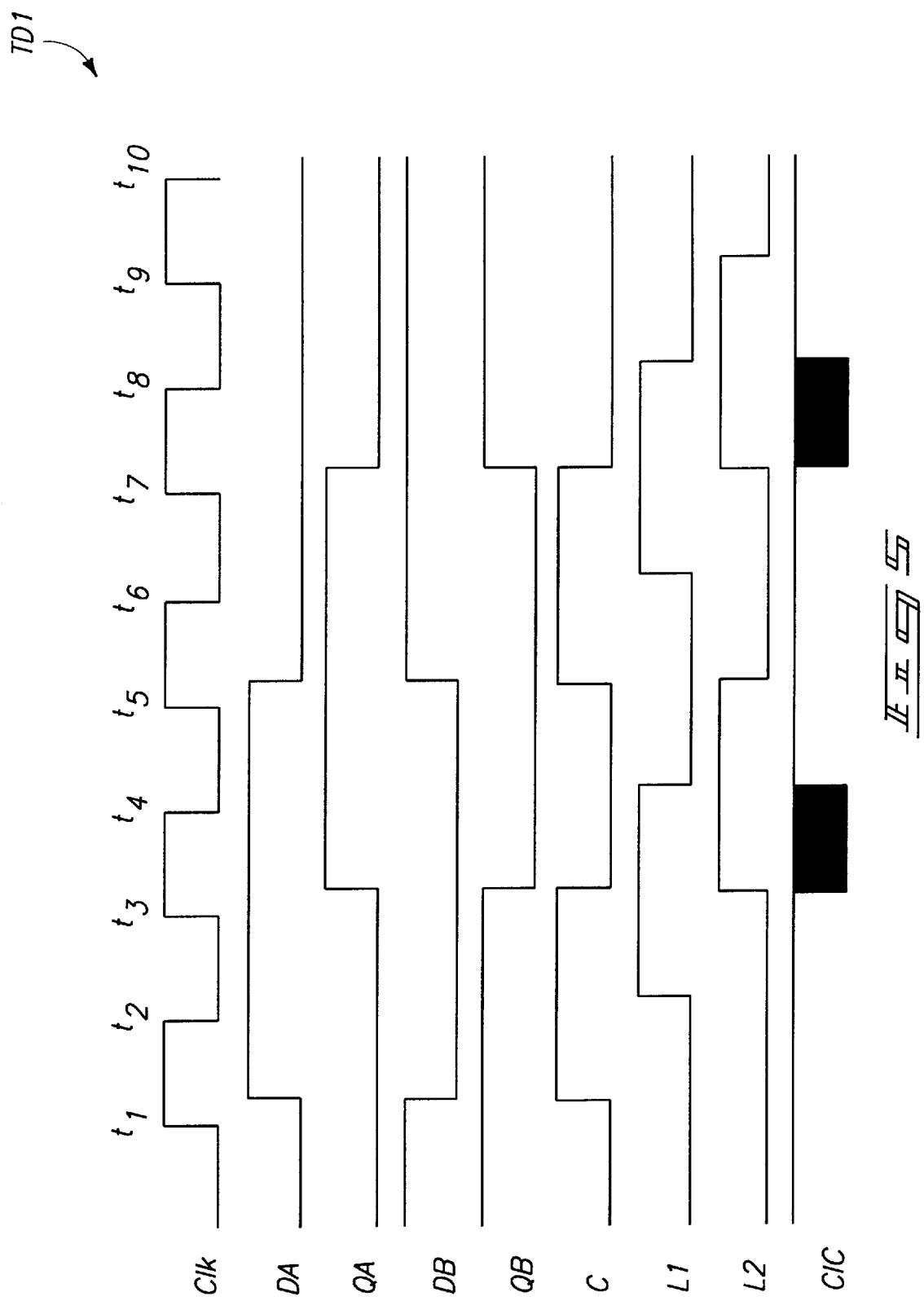
FIG. 5 is a simplified timing diagram for the circuit of FIG. 4, in accordance with an embodiment of the present invention.

FIG. 5 is a simplified timing diagram TD1 for the circuits 51 and 60 of FIG. 4, in accordance with an embodiment of the present invention. The timing diagram TD1 includes a top trace showing behavior of the clock signal CLK, with transitions in the clock signal CLK being denoted $t_1$–$t_{10}$, respectively. The timing diagram TD1 also includes traces sequentially descending below the trace corresponding to the clock signal CLK, respectively showing behavior of signals corresponding to the DA input to flip-flop 52, the QA output from flip-flop 52, the DB input to flip-flop 54, the QB output from flip-flop 54, the input C to the first latch 70, the outputs L1 and L2 from the first and second latches 70 and 72 and the reset input CIC to flip-flop 56 versus time. These signals are shown under conditions when the glitch may occur. The times corresponding to conditions when the glitch may occur are denoted by black boxes, indicating an unknown state, in the trace describing the CIC input to the flip-flop 56.

The circuit 78 detects conditions under which the glitch may occur. In this case, the glitch may occur when both of the outputs QA and QB switch at the same time and have values different from each other prior to and after switching. The XOR gate 62 detects that the flip-flop 52 is changing state at times $t_1$–$t_3$. Similarly, the XOR gate 64 detects that the flip-flop 54 is changing state at the same times. The XOR gate 66 detects a difference in state between outputs QA and QB of the flip-flops 52 and 54 during the interval when the flip-flops 52 and 54 are changing state. The AND gate 68 determines when all three conditions coexist, and then provides an output signal C. The signal C is strobed into the first latch 70 at time $t_2$. At time $t_3$, the logic "1" that is output from the first latch 70 is strobed into the second latch 72. As a result, an output signal S (FIG. 4) from the AND gate 74 causes the multiplexer 76 to couple a signal labeled "X" (FIG. 4), corresponding to an unknown value, to the reset input CIC (bottom trace, FIG. 5) of the flip-flop 56 during the interval from $t_3$ to $t_4$ (denoted by a black box, bottom trace).

Accordingly, when the net-list is modified in the steps 50 and 36–46, the ATPG tool provides a simulation result for the circuit 51 that will not result in a miscompare between simulated and measured test results. This simplifies analysis of the test results and facilitates development of new integrated circuit designs.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of operating on a net-list describing an integrated circuit design for use with an automated test pattern generator for testing an integrated circuit built using the design, the method comprising replacing a defective portion of the design in a test mode with a substitute circuit to reduce testing impact of the defective portion by identifying a first defective portion of the integrated circuit design in the net-list, determining conditions under which the first defective portion is likely to malfunction and replacing the first defective portion in the net-list with another first portion that provides unknown output signals representing an unknown state in response to conditions under which the first defective portion is likely to malfunction.

2. The method of claim 1, further comprising identifying a second defective portion of the integrated circuit design in the net-list, determining conditions under which the second defective portion is likely to malfunction and replacing the second defective portion in the net-list with another second portion that provides unknown output signals representing an unknown state in response to the conditions under which the second defective portion is likely to malfunction.

3. The method of claim 1, wherein replacing the first defective portion in the net-list comprises creating a net-list corresponding to a circuit that provides an output signal corresponding to the conditions under which the first defective portion is likely to malfunction, coupling the output signal to a toggle input of a multiplexer, coupling an unknown signal to a first input to the multiplexer and coupling a signal from the first defective portion to a second input to the multiplexer.

4. The method of claim 1, wherein replacing the first defective portion in the net-list comprises forming a net-list corresponding to: coupling an output of a multiplexer to a node corresponding to an output of the first defective portion, coupling an unknown signal to a first input to the multiplexer, coupling an output from the first defective portion to a second input to the multiplexer and toggling the multiplexer to couple the unknown signal to the multiplexer output when conditions under which the first defective portion is likely to malfunction are present.

5. The method of claim 4, wherein replacing the first defective portion in the net-list further comprises forming a net-list corresponding to toggling the multiplexer to couple the output from the first defective portion to the multiplexer output when conditions under which the first portion is likely to malfunction are not present.

6. The method of claim 1, wherein replacing the first defective portion in the net-list further comprises forming a net-list corresponding to replacing the first defective portion with combinatorial logic that identifies a beginning of a time during which the first defective portion is likely to malfunction.

7. The method of claim 6, wherein replacing the first defective portion in the net-list further comprises forming a net-list corresponding to replacing the first defective portion with synchronous logic that identifies a duration during which the first defective portion is likely to malfunction.

8. A method of generating test vectors to provide reduced numbers of miscompares between measured test results from a prototype integrated circuit design and simulated performance of the prototype integrated circuit design comprising:
   identifying timing conditions in the prototype integrated circuit design that cause improper flip-flop behavior;
   providing a circuit design that identifies a time and duration corresponding to conditions under which the improper flip-flop behavior occur;
   modifying a net-list corresponding to the prototype integrated circuit design to include the circuit design; and
   generating test vectors and simulated output signals corresponding to the modified net-list.

9. The method of claim 8, wherein creating a circuit design comprises coupling a signal having an unknown value through a multiplexer to a flip-flop when conditions under which the improper flip-flop behavior occur.

10. The method of claim 8, wherein creating a circuit design comprises creating a first circuit design that identifies a time when conditions under which the improper flip-flop behavior occur.

11. The method of claim 10, wherein creating a circuit design comprises creating a second circuit design that identifies a duration over which the conditions under which the improper flip-flop behavior exist.

12. The method of claim 8, wherein creating a circuit design comprises creating a combinatorial logic circuit design that identifies a time when conditions under which the improper flip-flop behavior occur.

13. The method of claim 12, wherein creating a circuit design comprises creating a sequential logic circuit design that identifies a duration over which the conditions under which the improper flip-flop behavior exist.

14. The method of claim 13, wherein creating a circuit design comprises coupling a signal having an unknown value through a multiplexer to a flip-flop for the duration identified by the sequential logic circuit.

15. The method of claim 12, wherein creating a circuit design comprises coupling a signal having an unknown value through a multiplexer to a flip-flop when the combinatorial logic circuit design identifies conditions under which the improper flip-flop behavior occur.

16. A method of improving testability of an integrated circuit design comprising identifying conditions under which behavior of a flip-flop in the integrated circuit design is likely deviate from behavior of the flip-flop predicted using an ATPG tool, determining a time when the conditions are initiated, determining a duration for the conditions, and simulating coupling a signal having an unknown value to the flip-flop in lieu of a signal associated with the conditions starting from the time when the conditions are initiated and for the duration for the conditions to provide simulated test responses that do not result in a miscompare between measured responses from the integrated circuit design and behavior of the flip-flop predicted using the ATPG tool.

17. The method of claim 16, wherein identifying conditions under which behavior of the flip-flop is likely to deviate from predicted behavior of the flip-flop comprises identifying conditions in a test mode of operation of scan test circuitry in the integrated circuit.

18. The method of claim 16, wherein simulating coupling a signal having an unknown value comprises simulating toggling of a multiplexer.

19. The method of claim 16, wherein simulating coupling a signal having an unknown value includes simulating combinatorial logic configured to identify a time at which behavior of the flip-flop is likely to deviate from behavior of the flip-flop predicted using an ATPG tool.

20. The method of claim 19, wherein simulating coupling a signal having an unknown value includes simulating sequential logic configured to identify a duration over which behavior of the flip-flop is likely to deviate from behavior of the flip-flop predicted using an ATPG tool.

* * * * *